United States Patent
Ogawa

(10) Patent No.: US 7,590,082 B2
(45) Date of Patent: Sep. 15, 2009

(54) RADIO TRANSMITTER AND TRANSMISSION POWER ADJUSTMENT METHOD

(75) Inventor: Ryutaro Ogawa, Tokyo (JP)

(73) Assignee: NEC Corporation, Tokyo (JP)

( * ) Notice: Subject to any disclaimer, the term of this patent is extended or adjusted under 35 U.S.C. 154(b) by 650 days.

(21) Appl. No.: 11/312,391

(22) Filed: Dec. 21, 2005

(65) Prior Publication Data
US 2006/0140145 A1   Jun. 29, 2006

(30) Foreign Application Priority Data
Dec. 27, 2004   (JP) ............................. 2004-378295

(51) Int. Cl.
*H04B 7/185* (2006.01)
(52) U.S. Cl. ...................... 370/318; 455/522
(58) Field of Classification Search ................. 455/522; 370/318
See application file for complete search history.

(56) References Cited

U.S. PATENT DOCUMENTS

| | | | |
|---|---|---|---|
| 5,974,093 A | 10/1999 | Lee | |
| 5,995,813 A * | 11/1999 | Ishikura et al. | 455/127.2 |
| 6,147,981 A * | 11/2000 | Prescott | 370/318 |
| 6,215,987 B1 * | 4/2001 | Fujita | 455/127.3 |
| 6,571,087 B1 | 5/2003 | Iwatsuki | |
| 2002/0012382 A1 * | 1/2002 | Schilling | 375/141 |
| 2003/0114127 A1 | 6/2003 | Baldwin | |
| 2006/0030351 A1 * | 2/2006 | Miller et al. | 455/522 |

FOREIGN PATENT DOCUMENTS

| | | |
|---|---|---|
| EP | 0 416 613 A2 | 3/1991 |
| JP | 2000-101456 A | 4/2000 |
| JP | 2004-072556 A | 3/2004 |
| JP | 2004-235966 A | 8/2004 |

* cited by examiner

*Primary Examiner*—Patrick N Edouard
*Assistant Examiner*—Shantell Heiber
(74) *Attorney, Agent, or Firm*—Foley & Lardner LLP

(57) ABSTRACT

Disclosed is a radio transmitter outputting transmission signals changing transmission modes. The transmitter includes a detection unit and a processing unit. The processing unit includes a three power adjustment modes. A first adjustment mode stores a detection result when the transmission power is so adjusted that, in any one of the transmission modes, an error between a transmission power m and a prescribed transmission power becomes minimized. A second adjustment mode stores a detection result, in other transmission modes when a difference between a detection result at a time when the transmission power is adjusted and a detection result stored at said any one of the transmission modes converges. A third adjustment mode performs feedback control such that, in a desired transmission mode, an error is minimized between a current detection result and a detection result stored when said first and second power adjustment mode.

10 Claims, 7 Drawing Sheets

RADIO TRANSMITTER AND TRANSMISSION POWER ADJUSTMENT METHOD

BACKGROUND OF THE INVENTION

1. Field of the Invention

The present invention relates to a radio transmitter such as portable terminal equipment and the like having a plurality of transmission modes, and its transmission power adjustment technology. Particularly, the present invention relates to a radio transmitter and its transmission power adjustment technology which quickly reduce a relative transmission power error among respective transmission modes.

2. Description of the Related Art

Conventional portable radio terminal equipment such as a portable telephone device and the like fixes its transmission mode during a telephone communication, and employs, in a few cases, a plurality of transmission modes while switching the transmission modes.

However, a high speed data rate communication such as High Speed Downlink Packet Access (HSDPA) system as a high speed transmission system in the portable telephone system has made an appearance. The HSDPA system employs multi-code for multiplexing a plurality of codes in one channel.

The HSDPA system changes a combination of a modulation system or an error correcting system. That is, the HSDPA system, when radio wave propagation condition is poor, employs a combination of a low speed Quadrature Phase Shift Keying (QPSK) modulation system and a low speed coding system with high error correction capability. While when the radio wave propagation condition is good, the HSDPA system employs a combination of a high speed 16 Quadrature Amplitude Modulation (16QAM) system and a high speed coding system with low error correction capability. Thus, the HSDPA system employs a plurality of codes with codes multiplexed into one channel by changing combinations of the modulation system and the error correction coding system according to the radio wave propagation condition.

In the case of the multi-code system, characteristics of the transmission signal vary caused by signal conditions such as the number of multiplexing, the modulation system or the like. Consequently, in order to employ a different transmission mode in accordance with the signal conditions, the multi-code system necessitates transmission power control according to the transmission mode.

At the time of high speed transmission, in the case that, for instance, sent is the signal with high transmission speed by using the multi-code system, the peak factor of the transmission signal becomes large, a distortion component of the amplifier output of the radio circuit becomes large, and the signal quality deteriorates. Therefore, high linearity of the amplifier or the like is demanded to minimize distortion. However, it is necessary to increase the amplifier current in order to improve the linearity of the amplifier. This increases power consumption, and transmission power, too.

Thus, the radio circuit using the HSDPA system is required to perform the transmission control being compatible to respective signal conditions according to the transmission mode. Therefore, its transmission signal power varies according to the transmission mode. Further, in the case of the HSDPA system, also, signal conditions differ greatly between an audio communication mode and a high speed data communication mode. Accordingly, it is necessary for the portable terminal to always control the transmission signal power into the optimum state when using a plurality of the transmission modes according to the signal conditions during communication.

Furthermore, a transmission circuit having such a plurality of transmission modes is required to minimize a relative transmission power error as small as possible among respective transmission modes, and to perform the transmission power adjustment in a short time, on the occasion of performing its transmission power adjustment.

A transmission power adjustment method conventionally carried out in the transmission circuit with a plurality of the transmission modes optimizes adjustment of the transmission power in respective transmission modes individually. Therefore, the radio transmitter having a large number of transmission modes cannot avoid increase of transmission power adjustment time.

Japanese Patent Application Laid-Open No. 2000-101456 (Document 1) has disclosed a radio transmission device provided with a first detection part and a second detection part at an automatic level control (ALC) part performing transmission power adjustment. The radio transmission device performs an ALC operation by obtaining a detection voltage from the first detection part at the time of low-output mode, and by obtaining a detection voltage from the second detection part at the time of high-output mode. The radio transmission device of the Document 1, thus, prevents breakdown of a detection diode on one hand, and sufficiently increases a level difference of transmission output in respective modes and attempts to reduce power consumption on the other hand.

However, the radio transmission device of the Document 1 increases the circuit size when the number of the transmission modes is large.

Further, Japanese Patent Application Laid-Open No. 2004-072556 (Document 2) has disclosed a transmitter and transmission power controlling method capable of stabilizing transmission power by compensating a change in diode detection efficiency due to temperature. The transmitter supplies a direct current bias voltage to a detection diode of the detection circuit to perform detection of the transmission signal, and measures and stores the detection output voltage. Further, the transmitter determines a difference between a stored detection output voltage and a current detection output voltage, and controls the gain of power control in a gain control circuit based on this difference signal. Thus, the transmitter of the Document 2 compensates a change in diode detection efficiency due to temperature to stabilize the transmission power.

However, since also the technology described in the Document 2, when the number of the transmission modes is large, generates control signals for each transmission power corresponding to each transmission mode, control becomes complicated and it takes much time for transmission power adjustment.

Furthermore, Japanese Patent Application Laid-Open No. 2004-235966 (Document 3) has disclosed a radio transmission apparatus in which constitution of a transmission power control part is simplified to reduce a mounting area. The radio transmission apparatus detects, at the time of transmission power adjustment mode, a transmission power level by receiving the transmission power at a receiving part to determine a control voltage of a variable gain amplifier circuit based on the detected level, and stores the control voltage into a memory. Then, the radio transmission apparatus optimizes, at the time of transmission mode, the transmission power by controlling the gain of the variable gain amplifier circuit by use of the stored control voltage. Since also the technology described in the Document 3, when the number of the transmission modes is large, generates control voltages for each transmission power corresponding to each mode, control becomes complicated and it takes much time for transmission power adjustment.

SUMMARY OF THE INVENTION

A first exemplary feature of the present invention provides, in a radio transmitter having a plurality of transmission modes, a radio transmitter quickly reducing a relative transmission power error among respective transmission modes with simple device constitution, without necessitating complicated control.

According to the first exemplary aspect of the present invention, there is provided a radio transmitter outputting transmission signals by changing transmission modes. The transmitter includes a detection unit and a processing unit. The processing unit includes a three power adjustment modes. A first adjustment mode stores a detection result when the transmission power is so adjusted that, in any one of the transmission modes, an error between a transmission power m and a prescribed transmission power becomes minimized. a second adjustment mode stores a detection result, in other transmission modes when a difference between a detection result at a time when the transmission power is adjusted and a detection result stored at said any one of the transmission modes converges. A third adjustment mode performs feedback control such that, in a desired transmission mode, an error is minimized between a current detection result and a detection result stored when said first and second power adjustment mode.

The first exemplary aspect of the invention performs transmission power adjustment by use of a transmission power measuring instrument taking much time only on a specified transmission mode 1. Transmission power adjustment of transmission modes other than the transmission mode 1 is performed without using the measuring instrument. Since the first exemplary aspect of the invention executes the transmission power adjustment requiring complicated control with specific one transmission mode limited, this aspect executes the power adjustment control quickly, even though the radio communication apparatus has many transmission modes. On this occasion, in other transmission modes, executed is an adjustment method of eliminating a relative difference between the specific mode and the other modes based on the APC detection result of the case of the specific transmission mode, therefore, it is possible to reduce a relative error among respective transmission modes.

BRIEF DESCRIPTION OF THE DRAWINGS

The above and other objects, features, aspects and advantages of the present invention will become apparent from the following detailed description when taken with the accompanying drawings in which.

DETAILED DESCRIPTION OF THE PREFERRED EMBODIMENTS

A radio transmitter of the invention is a radio transmitter in which a transmission unit outputs a transmission signal of a plurality of transmission modes. The radio transmitter includes a detection unit for generating a signal of a detection result while detecting the transmission signal, and a processing unit for generating a control voltage in order to adjust a transmission power of the transmission unit by performing calculation based on a signal of the detection result. In the present invention, in any one of the transmission modes (specific transmission mode), performed is a transmission power adjustment, which is so performed that an error between the transmission power measured with a transmission power measuring instrument and a prescribed transmission power becomes not more than a prescribed value. The radio transmitter of the present invention stores therein an APC detection result voltage value to be a final adjustment result at this one transmission mode.

The radio transmitter, in the transmission modes other than the specific transmission mode, feedback-controls such that a difference between an APC detection result voltage value at a time when the transmission power is adjusted in respective modes and a detection result voltage value stored at the specific transmission mode falls within a prescribed range. The radio transmitter thus carries out the transmission power adjustment, and stores therein the APC detection result voltage value at a time when this adjustment converges.

After the transmission power adjustment termination of respective transmission modes, in an arbitrary transmission mode, the radio transmitter causes a processing unit to execute feedback control such that the error between a current voltage value of the APC detection result and the voltage value of the APC detection result stored at the time of the transmission power adjustment termination becomes not more than predetermined value, while adjusting the transmission power in each transmission, whereby this makes it possible to recreate a transmission power state at the time of the transmission power adjustment termination in respective transmission modes.

Embodiment 1

Figure 1:
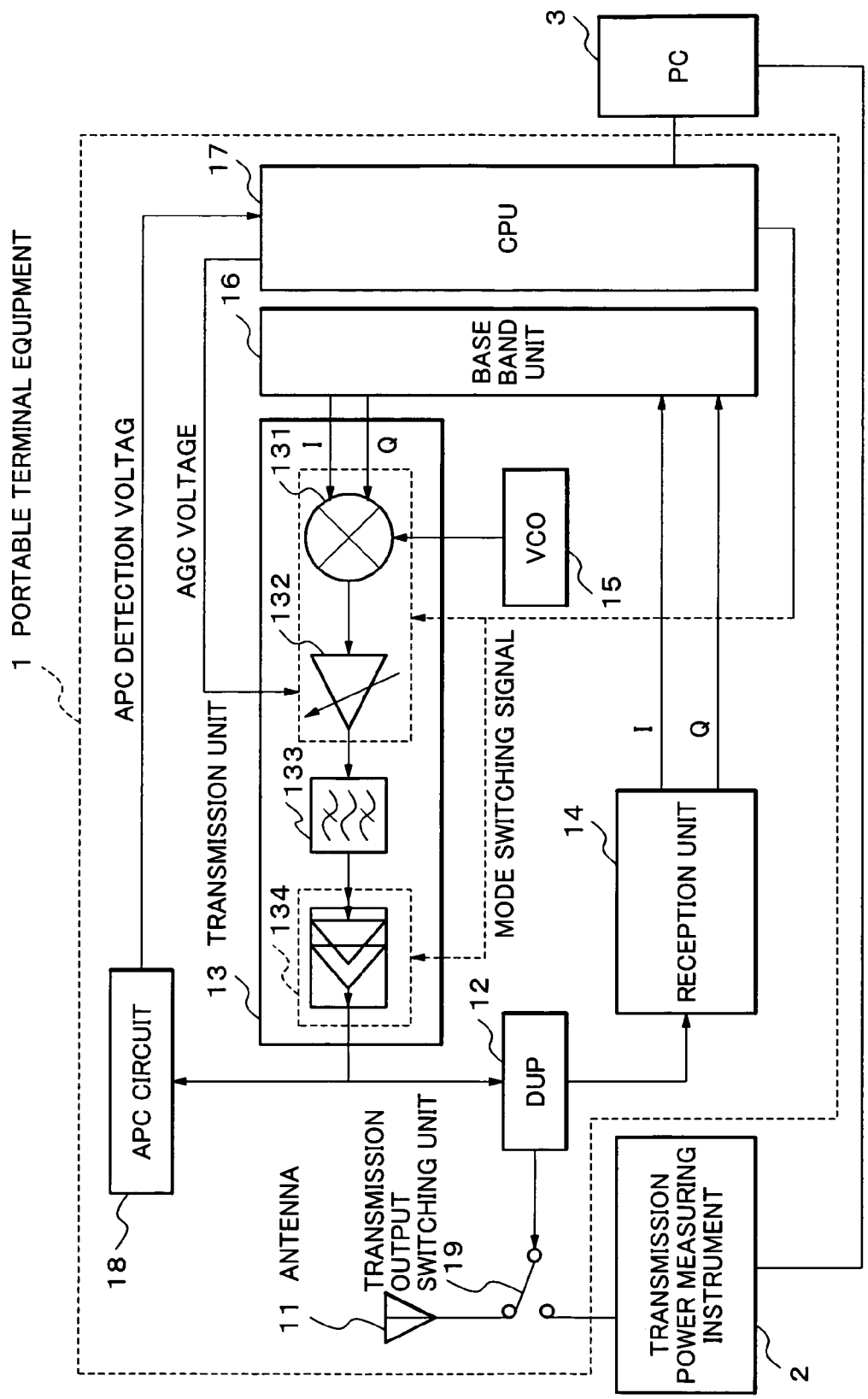
FIG. 1 is a block diagram showing constitution of a portable terminal equipment to be a first embodiment of the present invention.
Figure 2:
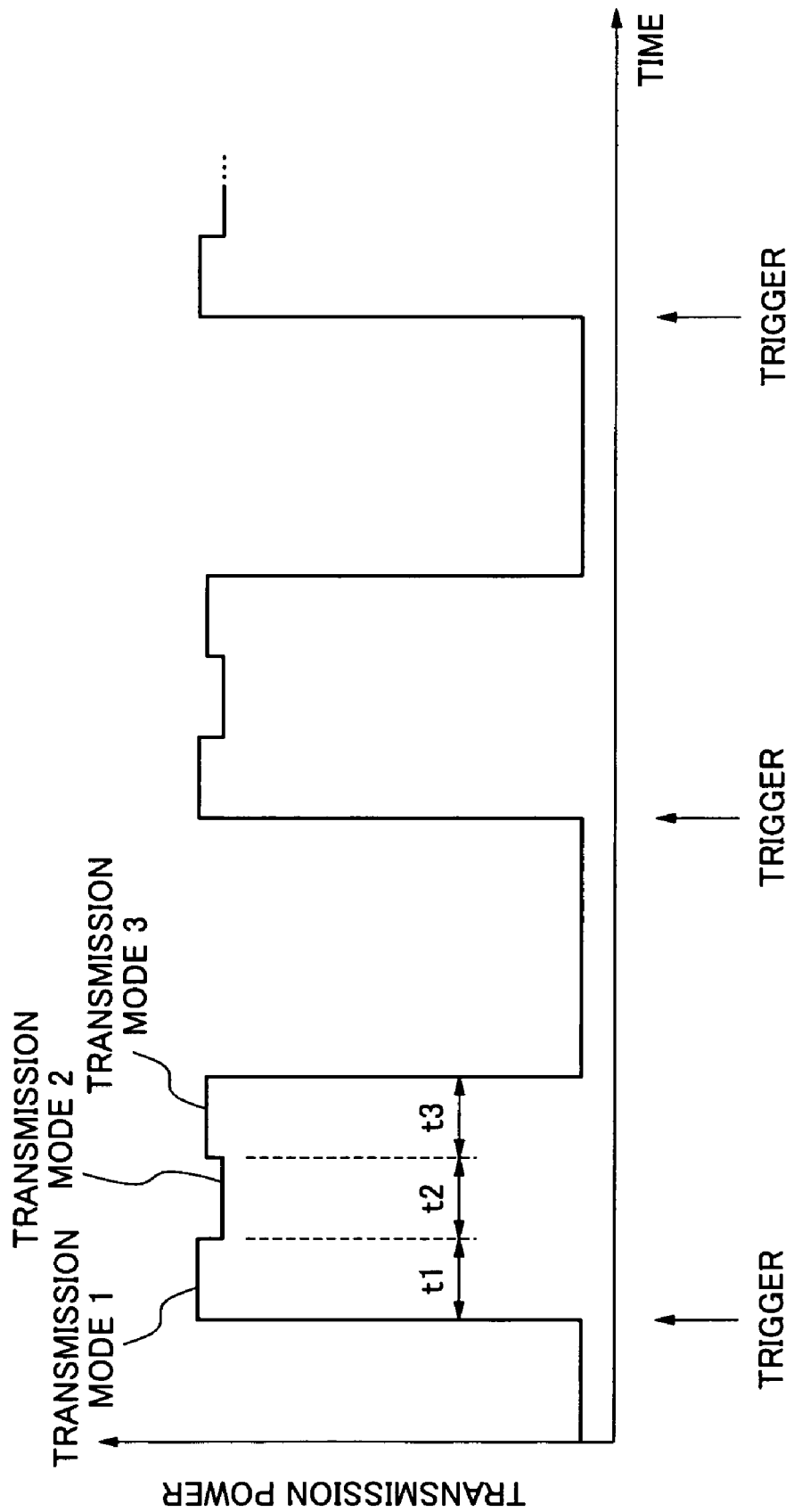
FIG. 2 is a diagram showing a state of generation of a burst transmission signal composed of a plurality of transmission modes.
Figure 3:
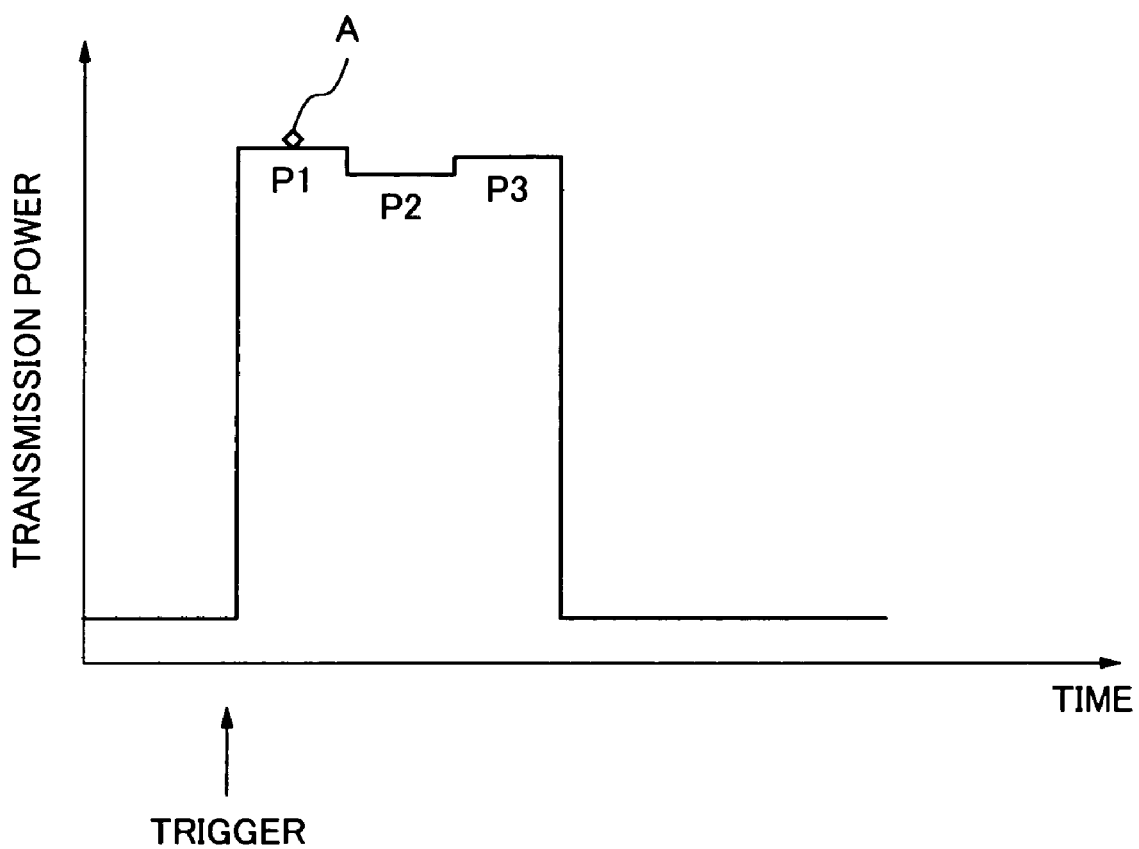
FIG. 3 is a diagram showing a transmission output for each transmission mode in the burst transmission signal.
Figure 4:
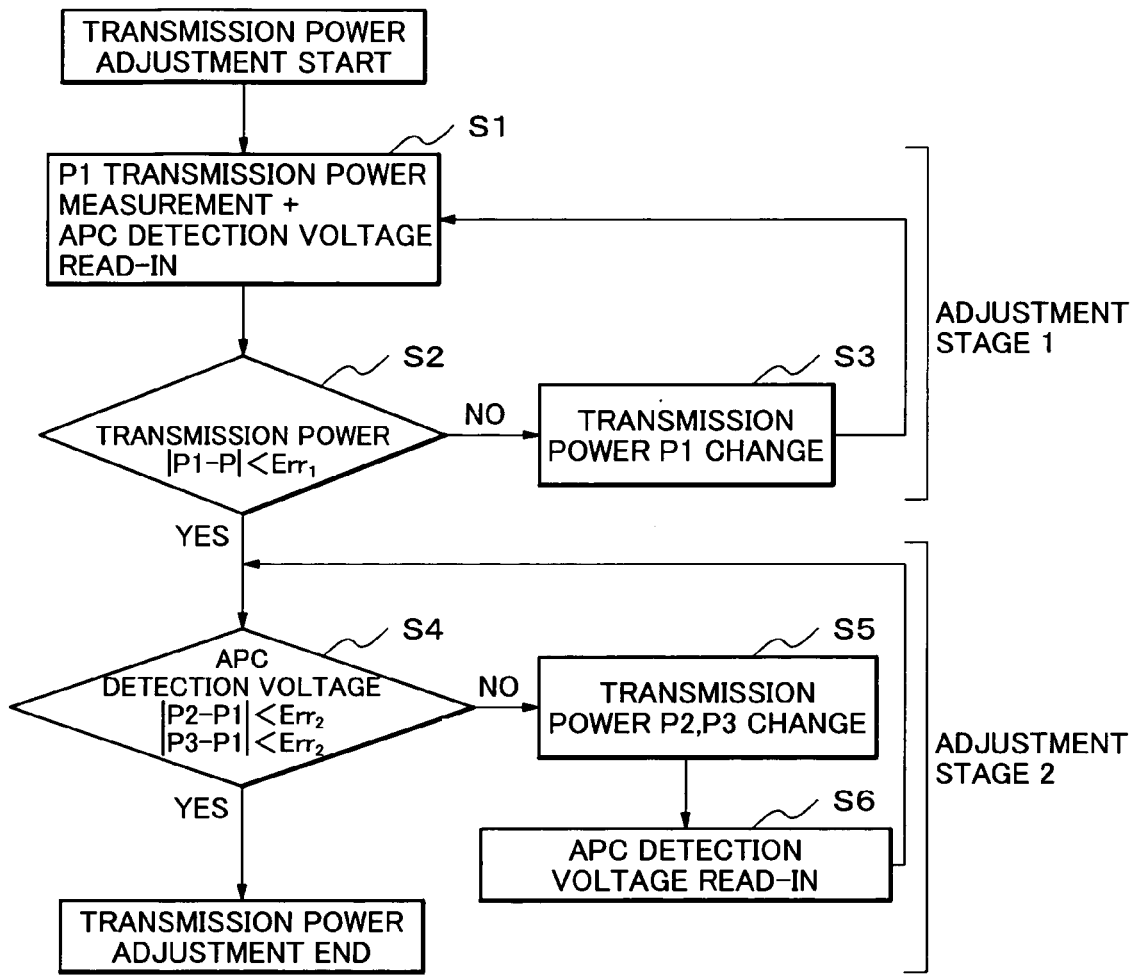
FIG. 4 is a flow chart showing transmission power adjustment processing procedure in the first embodiment.
Figure 5:
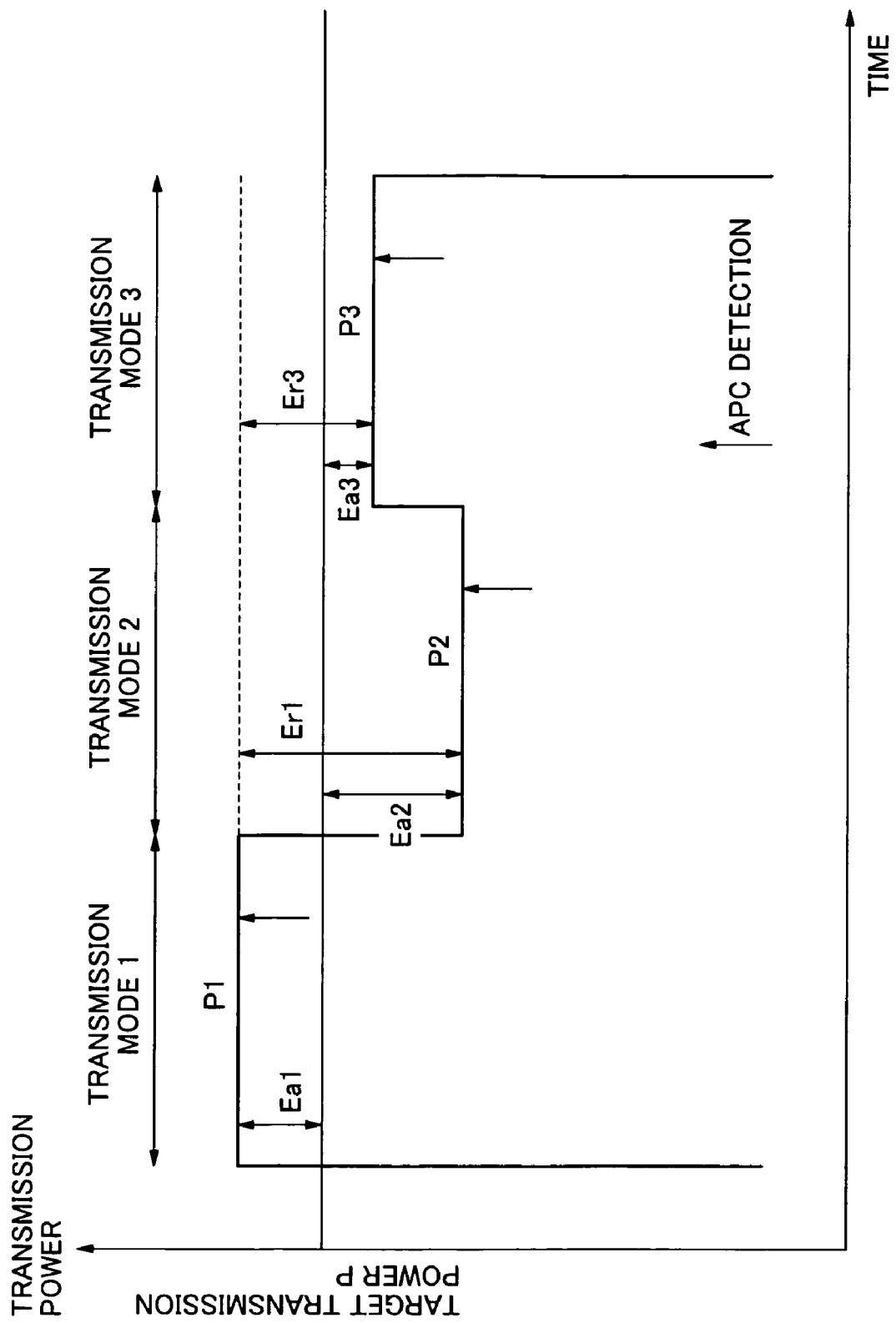
FIG. 5 is a diagram showing a condition of the transmission power at the time of a first stage transmission power adjustment in the first embodiment.
Figure 6:
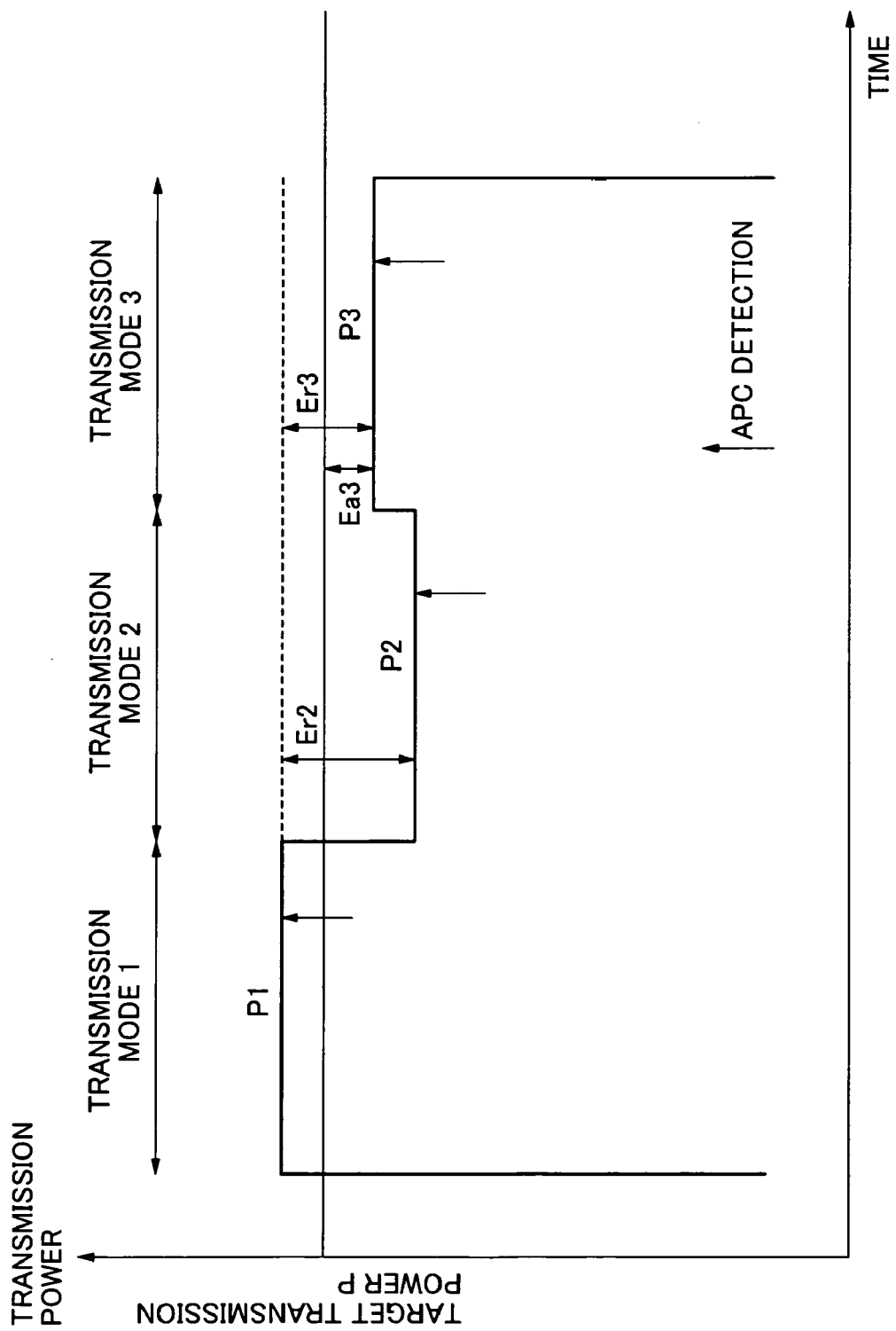
FIG. 6 is a diagram showing a condition of the transmission power at the time of a second stage transmission power adjustment in the first embodiment.

FIG. 1 is a block diagram showing constitution of a portable terminal equipment to be a first embodiment of the present invention, FIG. 2 is a diagram showing a state of generation of a burst transmission signal composed of a plurality of transmission modes, FIG. 3 is a diagram showing a transmission output for each transmission mode in the burst transmission signal, FIG. 4 is a flow chart showing transmission power adjustment processing procedure in the first embodiment, FIG. 5 is a diagram showing a condition of the transmission power at the time of a first stage transmission power adjustment in the equipment of the first embodiment, FIG. 6 is a diagram showing a condition of the transmission power at the time of a second stage transmission power adjustment in the equipment of the first embodiment.

The portable terminal equipment 1 of this embodiment, as shown in FIG. 1, includes: an antenna (ANT) 11; a duplexer (DUP) 12; a transmission unit 13; a reception unit 14; a voltage controlled oscillation circuit (VCO) 15; a base band unit 16; a central processing unit (CPU) 17; an automatic power control (APC) detection circuit 18; and a transmission output switching unit 19.

Further, the transmission unit 13 includes: a quadrature modulating circuit unit (hereinafter referred to as a mixer) 131; an excitation amplifier (hereinafter referred to as DRV) 132; a band pass filter (BPF) 133; and a power amplifier (PA) 134.

In FIG. 1, the antenna unit 11 performs transmission/reception of a radio frequency (hereinafter referred to as "RF") signal by the radio waves to/from the base station not illustrated in the drawings. The duplexer 12 supplies a transmission RF signal from the transmission unit 13 to the ANT unit 11, supplies a reception RF signal from the antenna unit 11 to the reception unit 14, and performs elimination of unnecessary waves. The transmission unit 13 converts a base band signal (composed of I signal and Q signal) from the base band unit 16 into the transmission RF signal in accordance with a variable carrier frequency signal from the VCO unit 15, variably amplifies the RF signal in accordance with the AGC (Automatic Gain Control) signal from the CPU 17, amplifies the RF signal to required power level corresponding to the transmission mode, and supplies the RF signal to the duplexer 12. The reception unit 14, selects a signal of a required band from the reception RF signals from the duplexer 12 to amplify, and then, converts the amplified signal into the base band signal composed of the IQ signals to supply the converted base band signal to the base band unit 16.

The VCO 15 supplies the carrier frequency signal in accordance with the transmission frequency band to the transmission unit 13. The base band unit 16 converts the transmission data such as an audio and video into the base band signal composed of the I signal and Q signal to supply the base band signal to the transmission unit 13, and generates reception data such as an audio and video from the base band signal supplied from the reception unit 14.

The CPU 17 controls the entire operation of the portable terminal equipment 1, and performs control for adjusting the transmission power to a prescribed value in accordance with the transmission mode and the transmission frequency.

The APC circuit 18 detects the transmission RF signal to supply the voltage depending on the RF power level to the CPU 17. The transmission output switching unit 19 connects the DUP 12 to the ANT 11 at a time when the portable terminal equipment 1 is used, and the DUP 12 to the external transmission power measuring instrument 2 at a time when the transmission power is adjusted according to the switching operation.

The mixer 131, in the transmission unit 13, quadrature-modulates the I signal and Q signal from the base band unit 16 depending on the carrier frequency signal supplied from the VCO 15. Further, the mixer 131 up-converts the modulation signal into the desired frequency to generate the transmission RF signal. The DRV 132 amplifies the transmission RF signal output from the mixer 131, and varies the gains at the time of amplification according to the AGC signal from the CPU 17. The BPF 133 composed of a bandpass filter eliminates unnecessary waves from the output of the DRV 132, and then supplies the DRV 132 output to the PA 134. The PA 134 amplifies the output signal of the BPF 133 to a required power level, and supplies it to the duplexer 12.

The mixer 131, the DRV 132 and the PA 134 switch a source current or a source voltage to the optimum operation condition according to the mode switching signal from the CPU 17, corresponding to the respective transmission modes, in order to improve the distortion characteristics, for example.

Hereinafter, there will be explained a transmission power adjustment method of the present embodiment with reference to FIGS. 1 to 6. In addition, in the following description, although there will be explained about the case of three transmission modes, the number of transmission modes may be arbitrarily plural.

In the transmitter of this embodiment, in the case of performing adjustment of the transmission power, the output of the duplexer 12 is connected to the transmission power measuring instrument 2 while operating the transmission power switching unit 9. As the transmission power measuring instrument 2, for instance, an RF power measuring instrument 2 constituted of a spectrum analyzer can be used. The RF power measuring instrument 2 is provided with a load with the same impedance as the ANT 11, and has a function of displaying visibly the RF voltage waveform generated in the load.

Further, a personal computer (hereinafter, referred to as PC for short) 3 causes the CPU 17 to operate the Digital Base Band (DBB) function in the CPU 17, by giving instructions to the CPU 17, whereby the PC 3 controls the signals of respective transmission modes so as to transmit the signals in a burst state, while sequentially switching the transmission modes 1, 2 and 3 in this order at a constant time interval based on the program prepared beforehand. At the same time, the CPU 17 controls the transmission output in each transmission mode, by outputting the mode switching signal and controlling the AGC voltage to the mixer 131, the DRV 132 and the PA 134.

FIGS. 2 to 3 illustrate an output state of the transmission signal in the case of this embodiment where time is indicated using a horizontal axis, and the transmission power is indicated using a vertical axis. In the case that there are three transmission modes, switching of the transmission modes 1, 2 and 3 is performed at a constant period in this order so as to sequentially perform transmission at a constant time interval (for instance t1=t2=t3=10 ms) in each transmission mode. As a result, the transmission unit repeatedly outputs the burst signal as shown in FIG. 2.

The transmission power measuring instrument 2 displays the respective burst signal waveforms by superimposing them on the same position, with a rise of the burst signal as a trigger. That is, since the transmission power measuring instrument 2, as shown in FIG. 3, displays the waveforms of the burst signals, the operator is capable of observing each level of the transmission powers P1, P2 and P3 corresponding to the transmission modes 1, 2 and 3.

A transmission power adjustment by use of the transmission power measuring instrument 2 is performed only in a phase of the transmission mode 1 in the burst signal, and the transmission power adjustment in the phases of the transmission modes 2 and 3 is performed by utilizing the APC function in a transmission circuit without using the transmission power measuring instrument 2.

In the transmission mode 1, the transmission power is so adjusted that the transmission power is within the range of a prescribed error value by varying the AGC voltage output from the CPU 17 based on instructions from the PC 3, while measuring the transmission power with the transmission power measuring instrument 2, and the APC detection voltage from the APC circuit 18 at that time is stored in the CPU 17.

In the transmission modes 2 and 3, the CPU 17 performs a feedback control of varying the AGC voltage value supplied to the transmission unit 13 so as to reduce an error while comparing the APC detection voltage of the transmission mode 1 and the APC detection voltage in the transmission modes 2 and 3, whereby the CPU 17 performs adjustment such that the transmission level of the transmission modes 2 and 3 converges within the range of the prescribed error value as compared to the transmission level in the case of the transmission mode 1, and the CPU 17 stores therein the APC detection voltage from the APC circuit 18 at that time.

The portable terminal equipment of this embodiment performs the transmission power adjustment in accordance with the flow chart shown in FIG. 4. In addition, in the following description, standard values of the transmission powers P1, P2 and P3 of the respective transmission modes 1, 2 and 3 should be equal (P1=P2=P3).

First, the transmission power adjustment of a stage 1 is performed using the transmission power measuring instrument 2. On this occasion, the CPU 17 supplies an AGC voltage initial value corresponding to a target transmission power P to the transmission unit 13 with the state that the IQ signals sent to the transmission unit 13 from the base band unit 16 are set to predetermined data modulation signals, and the transmission frequency (for instance, center frequency of transmission frequency band) in each transmission mode should be constant.

With this state, obtained is a measured value of the transmission power P1 in the transmission power measuring instrument 2, and the CPU 17 then reads therein the APC detection voltage value (STEP S1). A STEP S2 judges whether or not the measured value of the transmission power P1 of the transmission mode 1 is not more than a prescribed error value Err1 with respect to the target transmission power P. When this judgment result is "NO", processing of the CPU proceeds to STEP S3, and the CPU varies the AGC voltage value to modify the transmission power P1, then the processing of the CPU returns to STEP S1.

By performing such transmission power adjustment repeatedly, when the error between the transmission power measured value P1 of the transmission power measuring instrument 2 and the target transmission power P becomes not more than the prescribed error value Err1, the CPU terminates the transmission power adjustment of the transmission mode 1, and stores therein the APC detection voltage value p1 at that time. The stored value is used as an initial value of the AGC voltage value for the transmission power control at a time when actual data transmission is performed.

In the adjustment stage 1, as shown in FIG. 3, the transmission power measuring instrument 2 indicates, when the transmission power P1 becomes a desired value, a marker A at the position of P1 on the burst waveform of the transmission power measuring instrument 2. Instructions are given to the CPU 17 via the PC 3 due to this marker function. Based on the instructions, the CPU 17 reads the APC detection voltage value and the AGC voltage value corresponding to the transmission power P1 to store the values therein.

When the measured value of the transmission power P1 in the transmission mode 1 becomes not more than the prescribed error value Err1 with respect to the target transmission power P, the processing of the CPU proceeds to STEP S4, an adjustment of the second stage, that is, the adjustment of the transmission mode 2 and transmission mode 3 is started.

In the adjustment stage 2, the CPU 17 performs controls such as transmission power determination, frequency determination, and timing synchronization while using an automatic loop depending on the Digital Base Band (DBB function).

The CPU 17 calculates the AGC voltage value according to the APC detection voltage values p2 and p3 obtained in the transmission modes 2 and 3, with the APC detection voltage value p1 obtained by the adjustment of the adjustment stage 1 as the basis, and performs a setting of the transmission powers P2 and P3 depending on the AGC voltage. Therefore, in the adjustment stage 2, the CPU 17 does not perform the adjustment using the transmission power measuring instrument 2.

In the transmission modes 2 and 3, the CPU 17 sets timing while using the DBB function based on instructions of the PC 3. Then, the CPU 17, in STEP S4 of FIG. 4, detects the APC detection voltage values p2 and p3 at the time of the transmission modes 2 and 3. Then, an error between the transmission powers P2 and P3 represented by the APC detection voltages p2 and p3 and the transmission power P1 represented by the APC detection voltage p1 of the transmission mode 1 stored at the adjustment stage 1 is judged whether or not to be smaller than a prescribed error value Err2. When the judgment result is "NO", processing of the CPU 17 proceeds to STEP S5.

In the STEP S5, the CPU 17 varies the AGC voltage according to control volume calculated from the magnitude difference between the APC detection voltage values p2 and p3 and the APC detection voltage value p1. Then, the CPU 17, in STEP S6, reads the APC detection voltage value corresponding to the AGC voltage changed. After that, an operation of the CPU 17 returns to the STEP S4.

Such processing is performed repeatedly, and when the error between the transmission powers P2 and P3 and the transmission power P1 becomes smaller than the prescribed error value Err2, the CPU 17 terminates the transmission power adjustment of the transmission modes 2 and 3. The CPU 17 then stores the APC voltage value at that time, and further, respectively stores the AGC voltage value as an initial value.

After completion of the transmission power adjustment, the operator removes the transmission power measuring instrument 2, and fixes a connection of the transmission output switching unit 19 to the side of the ANT unit 11.

Hereinafter, by referring to FIGS. 5 and 6, there will be described variation of transmission power at the time of the transmission power adjustment.

FIGS. 5 and 6 represent time by using a horizontal axis, and the transmission power by using a vertical axis. FIGS. 5 and 6 represent the error against the target transmission power P in the transmission modes 1, 2 and 3 by using absolute errors Ea1, Ea2 and Ea3, and represent the relative errors of the transmission powers P2 and P3 of the transmission modes 2 and 3 against the transmission power P1 in the transmission mode 1 by using Er2 and Er3 respectively.

FIG. 5 shows a state of the transmission power in the adjustment stage 1. The adjustment in the adjustment stage 1 is adjustment for causing the absolute error of the transmission power P1 of the transmission mode 1 to converge, and the adjustment is performed repeatedly until the error Ea1 of the transmission power P1 becomes not more than Err1. Concerning the transmission powers P2, and P3 corresponding to the transmission modes 2 and 3, a feedback control function of the CPU 17 performs transmission power setting based on the APC voltage value and the AGC voltage initial value stored beforehand. However, since the objective of the adjustment stage 1 is not to cause the transmission powers of the transmission modes 2 and 3 to converge to not more than the prescribed error value Err1, the transmission power adjustment for the convergence is not performed.

FIG. 6 shows a state of the transmission power in the adjustment stage 2. At this time, the transmission power P1 of the transmission mode 1 already satisfies the conditions of Ea1<Err1, therefore, the adjustment of the transmission power P1 is not performed.

The adjustment of the transmission modes 2 and 3 is performed using the APC detection voltage values corresponding to the transmission powers P2 and P3 and the APC detection voltage value against the transmission power P1. An objective of the adjustment of the transmission modes 2 and 3 is to cause the errors against the transmission power P2 and the transmission power P, and the error of P3 against the transmission power P1 to converge to not more than the prescribed error value Err2, and not more than Err3, respectively.

When relative errors Er2 and Er3 of the transmission powers P2 and P3 of the transmission modes 2 and 3 against the transmission power P1 are Er2>Err2, Er3>Err2, the CPU 17 calculates control volume of the AGC voltage corresponding to the errors of the respective cases, and performs control varying the transmission power value while executing feedback of the AGC voltage modified depending on the control volume to the transmission unit 13. That is, the CPU 17 repeatedly executes the STEPs S4, S5 and S6 until the relative errors Er2 and Er3 of the transmission powers P2 and P3 against the transmission power P1 become Er2<Err2, Er3<Err2. When the transmission powers P2 and P3 become Er2<Err2, Er3<Err2 respectively, the CPU 17 terminates the transmission power adjustment of the adjustment stage 2.

The portable terminal equipment 1 is capable of recreating the transmission power state identical to that at the time of termination of the initial transmission power adjustment. After termination of the transmission power adjustment stage 2, the CPU 17 performs the feedback control so that a current APC voltage value becomes the APC voltage value stored at the time of termination of the transmission power adjustment of the respective transmission modes according to instructions of the transmission mode.

Needless to say, on this occasion, the next convergence of the feedback control will be capable of being performed quickly, when the transmission of the same transmission mode is performed, by storing the AGC voltage values of the respective transmission modes as the initial values while being rewritten to the voltage values at the time the feedback control of the transmission power converges.

Thus, the portable terminal equipment of this embodiment executes the transmission power adjustment by use of the transmission power measuring instrument 2 taking much time only in the transmission mode 1, and executes the transmission power adjustment of the transmission modes 2 and 3 without using the measuring instrument. For this reason, concerning the transmission modes other than the transmission mode 1, the portable terminal equipment of this embodiment is capable of performing adjustment relatively quickly as compared to the case of the transmission mode 1 requiring a complicated control. On this occasion, in the transmission modes 2 and 3, it is possible to reduce the relative error among the respective transmission modes, because employed is an adjustment method of eliminating the difference between the case of the transmission mode 1 and the cases of the transmission modes 2, and 3 based on the APC detection result in the case of the transmission mode 1.

Embodiment 2

In the above described embodiment (hereinafter referred to as the first embodiment), illustrated is the example of the case in which the portable terminal equipment adjusts the transmission power in each transmission mode. However, in the case that a transmission power frequency characteristic in a transmission frequency band differs in each transmission mode, it is necessary for a portable terminal equipment to equalize the transmission power frequency characteristic in each transmission mode.

Consequently, for example, even though, in the frequency of the adjustment point, the transmission power is equalized in respective transmission modes by the transmission power adjustment shown in the first embodiment, if the transmission power at another frequency has a different characteristic in each transmission mode, to correct such a difference for each frequency becomes necessary.

In addition, in the following description, a relationship between a transmission power value and an APC detection voltage value should be identical in the respective transmission modes.

Also, the adjustment of the case of this embodiment, like the case of the first embodiment, it is possible to perform the adjustment based on a program prepared beforehand by operating a DBB function in the CPU 17 while giving instructions to the CPU 17 from the PC 3.

Figure 7:
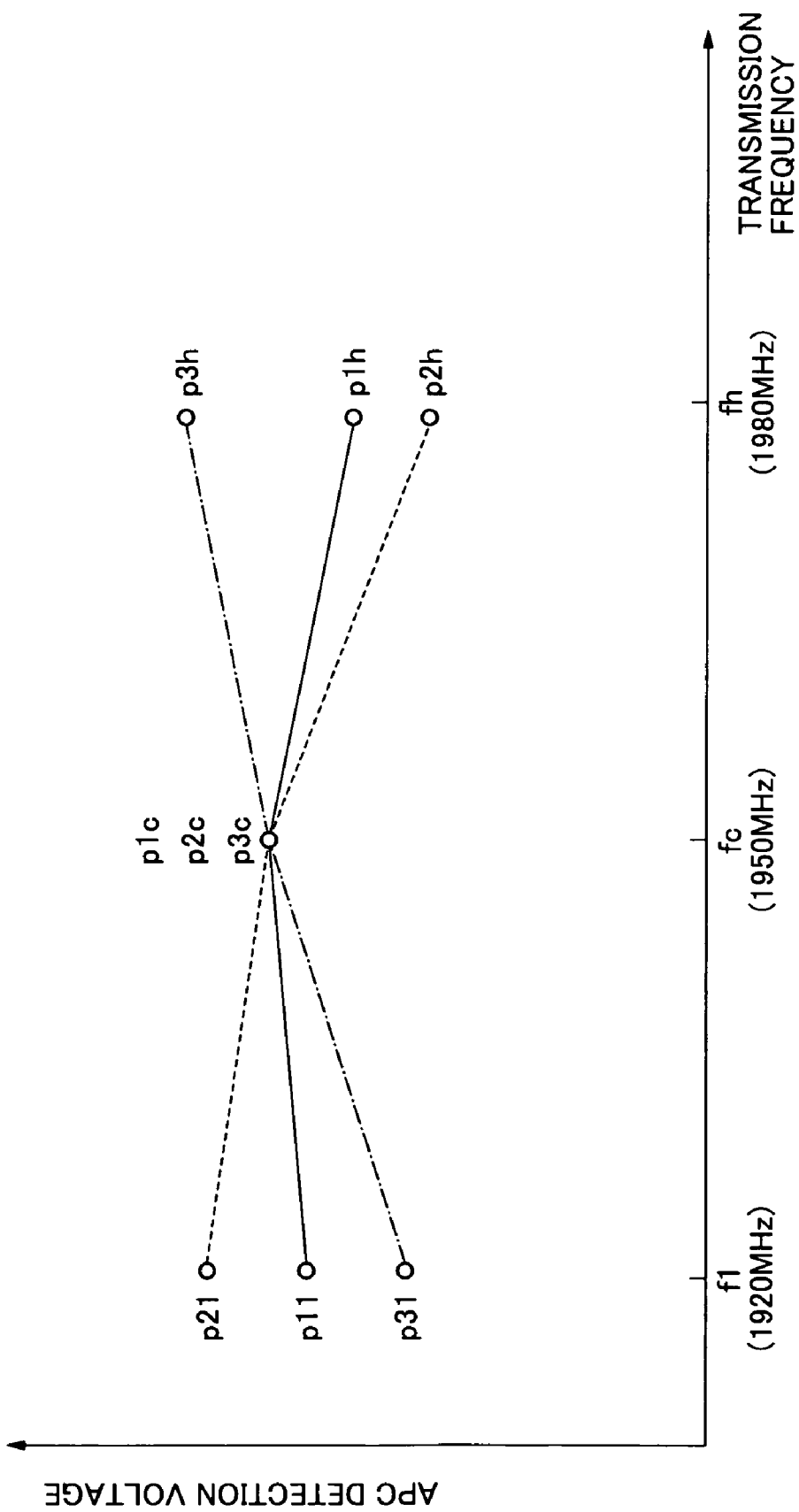
FIG. 7 is a diagram for explaining an adjustment method of a transmission power frequency characteristic in a second embodiment of the present invention.

FIG. 7 illustrates an adjustment method of the transmission power frequency characteristics in the case of this embodiment, and exemplifies APC detection voltage characteristics of the transmission modes 1, 2, and 3 by using a solid line, a broken line and a chain line respectively.

In FIG. 7, illustrated is the case that the APC detection voltage values when the transmission frequency is at three points of the lower end "fl" (1920 MHz), the center position "fc" (1950 MHz) and the upper end "fh" (1980 MHz) of the transmission frequency band of the case of, for instance, W-CDMA system, are (p1*l*, p1*c*, p1*h*), (p2*l*, p2*c*, p2*h*) and (p3*l*, p3*c*, p3*h*) in the case of the transmission modes 1, 2 and 3 respectively. In FIG. 7, in the position "fc" to be the transmission power adjustment point, due to the transmission power adjustment illustrated in the first embodiment, the APC detection voltages coincide in the respective transmission modes, however, the APC detection voltages have different values in the other frequencies "fl" and "fh".

In the adjustment stage 1, performed is the adjustment of the transmission power frequency characteristics within the transmission frequency band in anyone of the transmission modes while using the transmission power measuring instrument 2. On this occasion, the IQ signals sent to the transmission unit 13 from the base band unit 16 are set to certain constant data modulation signals.

FIG. 7, concerning the transmission mode 1, shows a result in which the transmission power adjustment is performed while varying the transmission frequency. FIG. 7, in the transmission mode 1, shows a result in which the error between the transmission power p1*l* at the lower end "fl" of the transmission frequency band and the transmission power p1*c* of the center position "fc" of the transmission band is adjusted not more than the prescribed error value. Further, FIG. 7 shows a result in which the error between p1*c* and the transmission power p1*h* at the upper end "fh" of the transmission frequency band is adjusted so as to become not more than the prescribed error value.

The CPU 17 stores therein the APC detection voltage values p1*l* and p1*h* in the respective frequencies at the time of adjustment termination, and terminates the adjustment stage 1 in the present embodiment.

In the adjustment stage 2, the present embodiment performs the adjustment of the transmission power frequency characteristics between different transmission modes. In this case, the CPU 17, based on the instructions of the PC 3, performs the transmission power adjustment of the transmission modes 2 and 3, with the frequency characteristics in the case of the transmission mode 1 in which the adjustment of the transmission frequency characteristics ends at the adjustment stage 1 as the basis. The CPU 17, in the respective transmission modes 2 and 3, performs the transmission power adjustment in the lower end "fl" and the upper end "fh" of the transmission frequency band. That is, the CPU 17 performs the adjustment in which the APC detection voltages (p2*l*, p2*h*), (p3*l*, p3*h*) of the transmission modes 2 and 3 at the lower end "fl" and the upper end "fh" of the transmission frequency band are corrected so as to fall within the prescribed error value as compared to the APC detection voltage (p1*l*, p1*h*) in the transmission mode 1.

Then, at the time of the adjustment termination, the CPU 17 stores the APC detection voltage values (p2*l*, p2*h*), (p2*l*, p2*h*) in the respective frequencies.

The portable terminal equipment 1, after adjustment termination of the transmission power frequency characteristics, is capable of recreating the same transmission power state as that at the time of adjustment termination of the initial transmission power frequency characteristics depending on the fact that the CPU 17 performs the feedback control so as to have the APC voltage value stored with respect to the respective transmission modes in the respective transmission frequencies according to the instructions of the transmission modes.

On this occasion, when the transmission frequency is different from the frequency subjected to the adjustment of the transmission power frequency characteristics, it is possible to obtain the APC voltage value against the frequency by performing linear interpolation according to the difference of the frequency, while employing the stored APC voltage value in terms of the frequency of the adjustment point of the transmission power frequency characteristics of the both upper and lower sides of the transmission frequency.

Thus, the portable terminal equipment of this embodiment adjusts the transmission power frequency characteristics in any one of the transmission modes so as to become not more than the prescribed error value in the transmission frequency band, and after that, the transmission power frequency characteristics of the other transmission modes are adjusted in such a way that, with the frequency characteristics of the adjusted transmission mode as the basis, the error between the transmission power frequency characteristics of the other transmission modes and the frequency characteristics of the adjusted transmission mode becomes not more than the prescribed error value, therefore, it is possible to perform quickly the adjustment of the transmission power frequency characteristics.

As above, there are described the embodiments of this invention in detail with reference to the drawings. The specific constitution is not limited to the embodiments. The present invention includes modifications of design or the like not departing from the gist of this invention. For instance, application of the present invention is not limited to the portable terminal equipment, and it is possible to apply to any radio transmission equipment if it has a plurality of the transmission modes. Further, in the respective embodiments, switching of the transmission mode does not depend on the control of the CPU 17 based on the DBB function, but the PC 3 connected to the external part of the portable terminal equipment may execute switching of the transmission mode with direct control thereof.

Furthermore, in the case of the first embodiment, the frequency at which the transmission power adjustment is performed is not limited to the center of the transmission frequency band, but it may be another position (for instance, low frequency end or high frequency end of the transmission frequency band).

While this invention has been described in connection with certain exemplary embodiments, it is to be understood that the subject matter encompassed by way of this invention is not be limited to those specific embodiments. On the contrary, it is intended for the subject matter of the invention to include all alternatives, modifications and equivalents as can be included with the sprit and scope of the following claims. Further, the inventor's intent is to retain all equivalents even if the claims are amended during prosecution.

What is claimed is:

1. A radio transmitter changing transmission signal of a plurality of transmission modes during communication according to radio wave propagation conditions, comprising:

a transmission unit for outputting a transmission signal of a plurality of transmission modes in which transmission power characteristics varies depending on the transmission mode and transmission power level is controlled by an AGC (Automatic Gain Control) signal;

a detection unit which generates an APC (Automatic Power Control) signal as a detection result of transmission power detection of said transmission signal outputted from the transmission unit; and a processing unit which performs transmission power adjustment of said transmission signal of respective transmission modes by varying the AGC signal to be supplied to the transmission unit based on the APC signal of said detection result outputted from the detection unit, wherein said processing unit includes:

first power adjustment means for performing a first power adjustment, by using a transmission power measuring instrument connected temporarily to the radio transmitter in which transmission power of the transmission signal of a specific transmission mode among the plurality of transmission modes is so adjusted that an error between a transmission power measured with the transmission power measuring instrument and a prescribed transmission power becomes not more than a prescribed value by varying the AGC signal to be supplied to the transmission unit, and storing an APC signal value at a time when the first power adjustment has completed as a first standard APC signal value;

second power adjustment means for performing a second power adjustment in which transmission power of the transmission signal of respective transmission modes other than the specific transmission mode is so adjusted that a difference between an APC signal value corresponding to the transmission power of the transmission signal of respective transmission modes other than the specific transmission mode being adjusted and the first standard APC signal value falls within a prescribed range by performing a feedback control of varying the AGC signal to be supplied to the transmission unit, and stores an APC signal value at a time when the second power adjustment has completed as a second standard APC signal value; and third power adjustment means for performing a third power adjustment in which transmission power of an actual data transmission signal of a desired transmission mode is so adjusted that an error between an APC signal value corresponding to the transmission power of the actual data transmission signal and one of the first standard APC signal value and the second APC signal value corresponding to the desired transmission mode becomes not more than a predetermined value by performing a feedback control of varying the AGC signal to be supplied to the transmission unit.

2. The radio transmitter according to claim 1, wherein said processing unit further comprising:

burst signal outputting means which controls the transmission unit to repeatedly output burst signals in which the transmission signal of respective transmission modes is sequentially switched in a predetermined order at a constant time interval in each transmission mode.

3. The radio transmitter according to claim 2, wherein said first power adjustment means performs the first power adjustment with referring to a waveform of the burst signals outputted repeatedly for the specified transmission mode in which a plurality of waveforms have been superimposed on the same position with a rise of the burst signal as a trigger.

4. The radio transmitter according to claim 3, wherein the transmission power of the transmission signal of respective transmission modes is adjusted at a specific frequency in a related transmission frequency band, and the first standard APC signal value and the second standard APC signal value are stored as a standard APC signal value of specific frequency and a second standard APC signal value of specific frequency, respectively, and wherein, the first power adjustment means further performing a power adjustment for transmission power of other frequency than the specific frequency in the transmission frequency band in which the transmission power of other frequency is so adjusted that an error between the transmission power of other frequency measured with the transmission power measuring instrument and the adjusted transmission power of specific frequency becomes not more than a prescribed value by varying the AGC signal to be supplied to the transmission unit, and stores an APC signal value corresponding to the adjusted transmission power of other frequency as a first standard APC signal value of other frequency, the second power adjustment means further performing a power adjustment for transmission power of other frequency than the specific frequency of respective transmission modes other than the specific transmission mode is so adjusted that a difference between an APC signal value corresponding to the transmission power of other frequency than the specific frequency of respective transmission modes other than the specific transmission mode being adjusted and the first standard APC signal value of other frequency falls within a prescribed range by performing the feedback control, and stores an APC signal value corresponding to the adjusted transmission power of other frequency than the specific frequency of respective transmission modes other than the specific transmission mode as a second standard APC signal value of other frequency, and the third power adjustment means further performing a power adjustment for transmission power of an actual data transmission signal of other frequency than the specific frequency of a desired transmission mode is so adjusted that an error between an APC signal value corresponding to the transmission power of the actual data transmission signal of other frequency than the specific frequency and one of the first standard APC signal value of other frequency and the second APC signal value of other frequency corresponding to the desired transmission mode becomes not more than a predetermined value by performing the feedback control.

5. A transmission power adjustment method of a radio transmitter including a transmission unit for outputting transmission signal of a plurality of transmission modes in which transmission power characteristics varies depending on the transmission mode and transmission power level is controlled by AGC (Automatic Gain Control) signal, comprising the steps of:

generating an APC (Automatic Power Control) signal as a detection result of transmission power detection of said transmission signal outputted from the transmission unit;

performing a first power adjustment for transmission power of the transmission signal of a specific transmission mode among the plurality of transmission modes, which includes adjusting an error between a transmission power measured with a transmission power measuring instrument connected temporarily to the radio transmitter and a prescribed transmission power becomes not more than a prescribed value by varying the AGC signal to be supplied to the transmission unit, and storing an APC signal value corresponding to the adjusted transmission power as a first standard APC signal value;

performing a second power adjustment for transmission power of the transmission signal of respective transmission modes other than the specific transmission mode, which includes adjusting a difference between the first standard APC signal value having been stored and an APC signal value corresponding to the transmission power being adjusted for the transmission signal of respective transmission modes other than the specific transmission mode falls within a prescribed range by performing a feedback control of varying the AGC signal to be supplied to the transmission unit, and storing an APC signal value corresponding to the adjusted transmission power of the transmission signal of respective transmission modes other than the specific transmission mode as a second standard APC signal value; and performing a third power adjustment for transmission power of an actual data transmission signal of a desired transmission mode, which includes adjusting an error between an APC signal value corresponding to the transmission power of the actual data transmission signal and one of the first standard APC signal value and the second APC signal value corresponding to the desired transmission mode being measured becomes not more than a predetermined value by performing a feedback control of varying the AGC signal to be supplied to the transmission unit.

6. The transmission power adjustment method according to claim 5, further comprising:

controlling the transmission unit to repeatedly output burst signals in which the transmission signal of respective transmission modes is sequentially switched in a predetermined order at a constant time interval in each transmission mode.

7. The transmission power adjustment method according to claim 6, wherein said adjusting step in the performing a first power adjustment step includes a step of referring to a waveform of the burst signals outputted repeatedly for the specified transmission mode in which a plurality of waveforms have been superimposed on the same position with a rise of the burst signal as a trigger when adjusting the error between the transmission power measured with the transmission power measuring instrument and the prescribed transmission power.

8. The transmission power adjustment method according to claim 7, wherein the transmission power of the transmission signal of respective transmission modes is adjusted at a specific frequency in a related transmission frequency band.

9. The transmission power adjustment method according to claim 8, further comprising:
   storing the first standard APC signal value and the second standard APC signal value as a standard APC signal value of specific frequency and a second standard APC signal value of specific frequency, respectively;
   performing a power adjustment for transmission power of other frequency than the specific frequency in the transmission frequency band, which includes
      adjusting an error between the transmission power of other frequency measured with the transmission power measuring instrument and the adjusted transmission power of specific frequency becomes not more than a prescribed value by varying the AGC signal to be supplied to the transmission unit, and
      storing an APC signal value corresponding to the adjusted transmission power of other frequency as a first standard APC signal value of other frequency;
   performing a power adjustment for transmission power of other frequency than the specific frequency of respective transmission modes other than the specific transmission mode, which includes
      adjusting a difference between the first standard APC signal value of other frequency having been stored and an APC signal value corresponding to the transmission power being adjusted for other frequency than the specific frequency of respective transmission modes other than the specific transmission mode falls within a prescribed range by performing the feedback control, and
      storing an APC signal value corresponding to the adjusted transmission power of other frequency than the specific frequency of respective transmission modes other than the specific transmission mode as a second standard APC signal value of other frequency, and
   performing a power adjustment for transmission power of an actual data transmission signal of other frequency than the specific frequency of a desired transmission mode, which includes
      adjusting an error between an APC signal value corresponding to the transmission power of the actual data transmission signal of other frequency than the specific frequency and one of the first standard APC signal value of other frequency and the second APC signal value of other frequency corresponding to the desired transmission mode becomes not more than a predetermined value by performing the feedback control.

10. The transmission power adjustment method according to claim 9, wherein said method carries out a transmission power frequency characteristics adjustment of said respective transmission modes under a predetermined modulation signal input state and a predetermined transmission frequency state.

* * * * *